US 6,567,289 B1

(12) United States Patent
Cleveland et al.

(10) Patent No.: US 6,567,289 B1
(45) Date of Patent: May 20, 2003

(54) PHYSICAL MEMORY LAYOUT WITH VARIOUS SIZED MEMORY SECTORS

(75) Inventors: Lee Cleveland, Santa Clara, CA (US); Yong Kim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 96 days.

(21) Appl. No.: 09/644,359

(22) Filed: Aug. 23, 2000

(51) Int. Cl.[7] .................................................. G11C 5/06
(52) U.S. Cl. ...................... 365/63; 365/51; 365/230.03; 711/163; 711/202
(58) Field of Search ....................... 365/63, 51, 230.03; 711/163, 202

(56) References Cited

U.S. PATENT DOCUMENTS

| | | | |
|---|---|---|---|
| 4,831,587 A | 5/1989 | Taninaka et al. | |
| 5,204,842 A | 4/1993 | Umeki | |
| 5,394,537 A | * 2/1995 | Courts et al. | ............... 711/202 |
| 5,636,158 A | 6/1997 | Kato et al. | |
| 5,774,398 A | 6/1998 | Ishida | |
| 5,831,898 A | 11/1998 | Ishida et al. | |
| 5,831,912 A | 11/1998 | Mueller et al. | |
| 5,943,253 A | 8/1999 | Matsumiya et al. | |
| 6,016,390 A | 1/2000 | Mali et al. | |
| 6,029,963 A | 2/2000 | Saeki | |
| 6,041,016 A | * 3/2000 | Freker | ................... 365/230.02 |
| 6,043,521 A | 3/2000 | Shibutani et al. | |
| 6,056,783 A | 5/2000 | Yoo et al. | |
| 6,181,598 B1 | * 1/2001 | Matsubara et al. | ......... 257/315 |
| 6,339,815 B1 | * 1/2002 | Feng et al. | ................. 711/152 |

* cited by examiner

*Primary Examiner*—Richard Elms
*Assistant Examiner*—Van Thu Nguyen
(74) *Attorney, Agent, or Firm*—Wagner, Murabito, Hao LLP

(57) ABSTRACT

The physical layout of a semiconductor memory device having memory sectors of varying sizes can be arranged such that the larger and smaller memory sectors are addressed by x-decoders and y-decoders via word lines and bit lines, respectively. The smaller memory sectors are laid out such that some of the small memory sectors are connected with a y-decoder or multiple y-decoders via different bit-lines. The smaller memory sectors are interspersed with the large memory sectors and an area near a corner of the memory device that can be used for other components such as peripheral devices. Optional physical to logical mapping of address allow the smaller memory sectors to be addressed in the first or the last memory addresses.

17 Claims, 3 Drawing Sheets

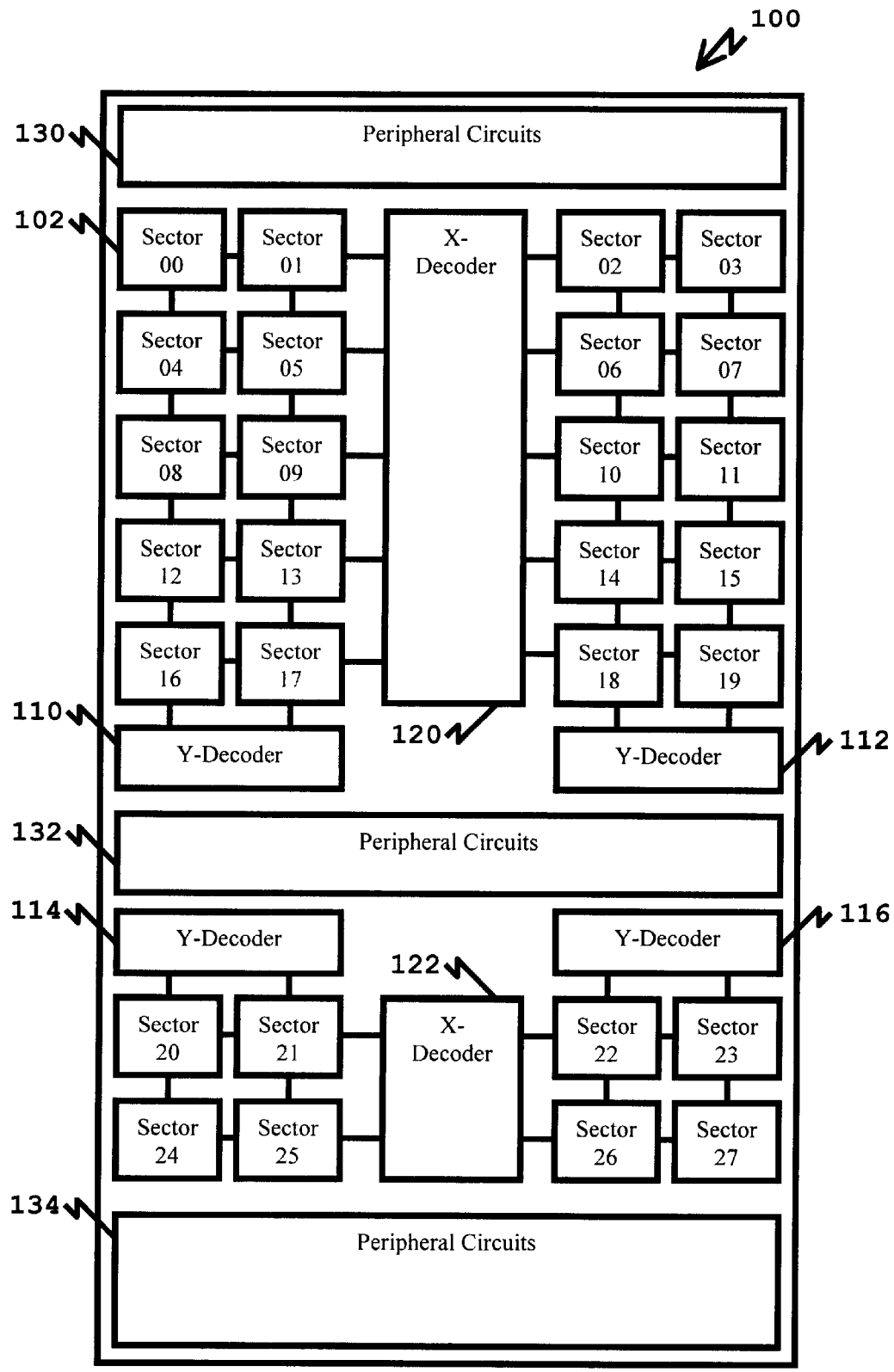
Figure 1
(conventional)

PHYSICAL MEMORY LAYOUT WITH VARIOUS SIZED MEMORY SECTORS

BACKGROUND

The present invention relates generally to a method of laying out memory sectors.

Flash memory devices have been widely used in computers and mobile devices such as cellular telephones, digital cameras, and video games. The flash memory devices can include a memory array, an address decoder, and data lines. The memory array is often divided into sectors. Flash memory devices can have sector protection that protects the data stored in a memory sector; the sector protection blocks the erase and program functions. Multiple sectors can be protected at one time; the status of protection for each memory sector is stored. A memory sector includes one or more memory cells.

As illustrated in FIG. 1, a memory array 100 includes a set of memory sectors 102, y-decoders 110, 112, 114, 116, x-decoders 120, 122, and peripheral circuits 130, 132, 134. The memory sectors 102 are arranged in regular geometric patterns comprising rows and columns. The memory sectors 102 are of uniform physical dimensions and each hold the same amount of data.

BRIEF SUMMARY

The physical layout of a semiconductor memory device having memory sectors of varying sizes can be arranged such that the larger and smaller memory sectors are addressed by x-decoders and y-decoders via word lines and bit lines, respectively. The smaller memory sectors are laid out such that at least some of the small memory sectors are connected with a y-decoder or multiple y-decoders via different bit-lines. Such a bit-line can connect with smaller and larger memory sectors to a y-decoder. The smaller memory sectors are interspersed with the large memory sectors and an area near a corner of the memory device that can be used for other components such as peripheral devices. Optional physical to logical mapping of address allow the smaller memory sectors to be addressed in the first or the last memory addresses.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

FIG. 1 is an illustration of a conventional memory array with a set of uniform sized memory sectors;

DETAILED DESCRIPTION

The physical layout of a memory array with memory sectors of varying sizes can be made by arranging the memory cells such that a residual area is located near a corner of the memory array that is not traversed by data lines, address lines or control lines. Optionally, a modified addressing scheme is used to translate the physical addresses to the logical addresses.

Conventional memory arrays use regularly located memory sectors as illustrated in FIG. 1. However, it is often desirable to have memory sectors of varying sizes in a single memory array. A common application where varying sized memory sectors are use is where it is desirable to have a memory sector dedicated to a specific task. Since memory can be locked sector-by-sector, it is desirable to have a memory sector dedicated to the specific task. Since the memory sectors are individually lockable and unlockable, it is desirable to match the size of the memory sector with the size of the data to be stored in each sector. It is desirable to be able to address the memory array containing memory sectors of various sizes in the same manner as conventional memory arrays. Thus, it is preferred that the size of the memory array remains the same whether the memory sectors have uniform memory size or whether the memory sectors include memory sectors of various memory sizes. Thus, in one embodiment the second size memory sectors have a total memory size equal to one or more of the first size memory sectors.

Figure 2:
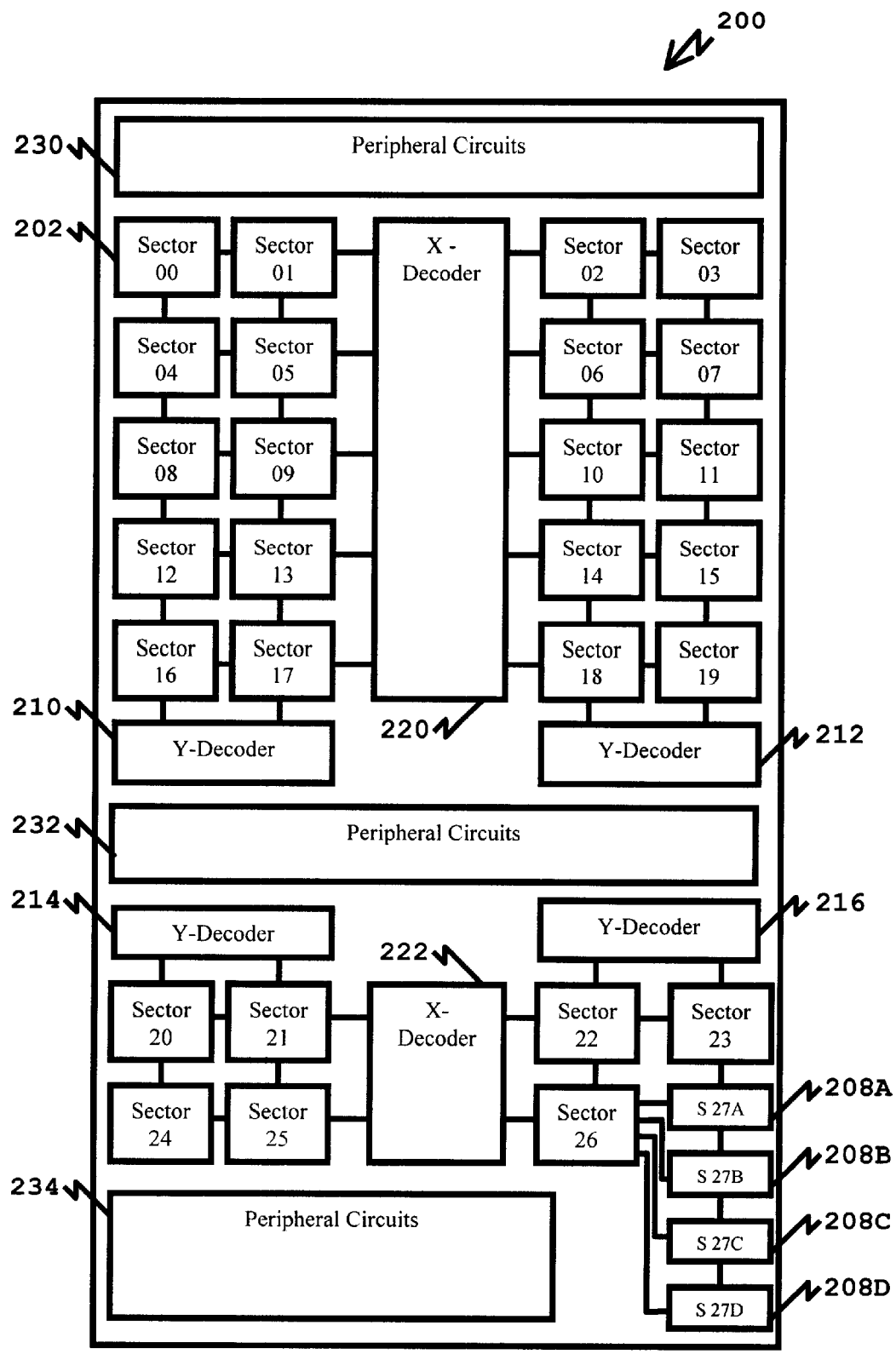
FIG. 2 is an illustration of a memory array with two sets of memory sectors with reduced area for peripheral circuits.

As illustrated in FIG. 2, a memory array 200 includes a set of large memory sectors 202, a set of small memory sectors 208A, 208B, 208C, 208D, x-decoders 220, 222, y-decoders 210, 212, 214, 216, and peripheral circuits 230, 232, 234. The large memory sectors 202 are labeled Sector 00, Sector 01 . . . Sector 26. An advantage of this configuration is that the y-decoder 216 and the x-decoder 222 have a similar addressing scheme as conventional y-decoder 116 (FIG. 1) and x-decoder 122 (FIG. 1).

The small memory sectors 208A, 208B, 208C, 208D and the large memory sectors 202 can not be arranged in a simple rectangular area. This results in a reduction of the available space for peripheral circuits 234. Further, the word-lines the connect the x-decoder with the small memory sectors 208A–D require more area. This results in the for the is reduced to accommodate the additional physical space required for the small memory sectors 208A–D being shifted to the left. Also, such word-lines have undesirable characteristics including: different lengths and multiple right angle turns.

Figure 3:
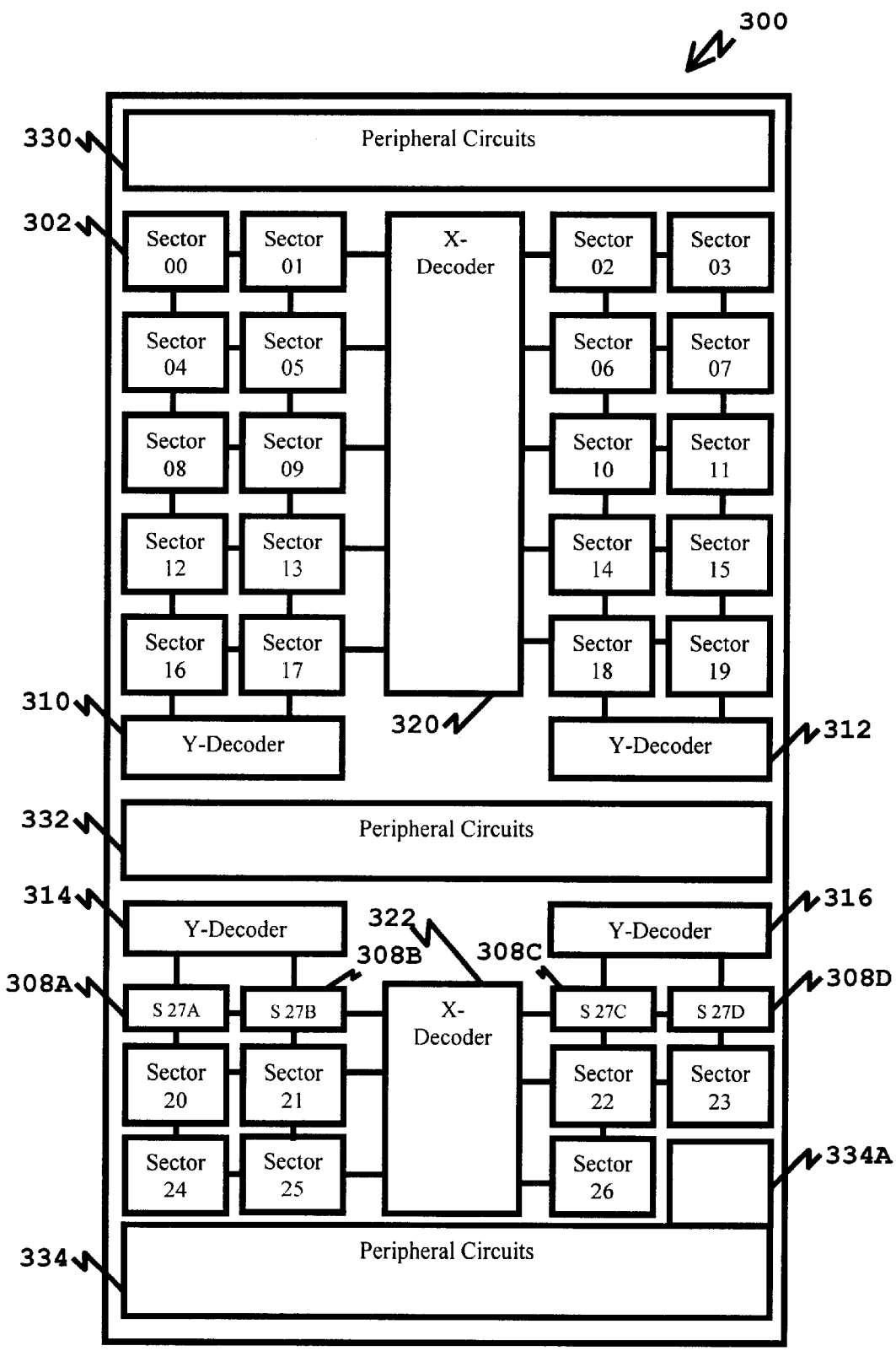
FIG. 3 an illustration of a memory array with two sets of memory sectors with increase are for peripheral circuits.

As illustrated in FIG. 3, a memory array 300 includes a set of large memory sectors 302, a set of small memory sectors 308A, 308B, 308C, 308D, x-decoders 320, 322, y-decoders 310, 312, 314, 316, and the optional peripheral circuits 330, 332, 334. The large memory sectors 302 are labeled Sector 00, Sector 01 . . . Sector 26.

The large memory sectors 302 are typically substantially rectangular when viewed from above the memory array, as illustrated in FIG. 3. However, the large memory sectors 302 can be other shapes. The large memory sectors 302 have dimensions normally measured in the X and Y directions. When large memory sectors 302 is rectangular, its physical dimensions are its length in the X and Y directions. small memory sectors 308A, 308B, 308C, 308D (308A–D) are arranged such that they are aligned with the y-decoders and the x-decoders. By aligning the small memory sectors 308A–D is this manner, the area required for routing the signal lines from the y-decoders and the x-decoders is reduced. As illustrated by comparing FIGS. 2 and 3, the height of the peripheral circuits 334 (FIG. 3) is less than the height of the peripheral circuits 234 (FIG. 2). However, the width of the peripheral circuits 334 is greater than the width of the peripheral circuits 234. Additionally, the peripheral circuits 334 in FIG. 3 also includes an additional area (also called a residual area) for peripheral circuits 334A. Indeed, the total area for peripheral circuits 334, 334A is over a third larger than the area for peripheral circuits 234. The creation of the additional area for peripheral circuits, especially near a corner of the memory array 300 is a benefit of the present invention.

The small memory sectors 308A–D are typically substantially rectangular when viewed from above the memory array, as illustrated in FIG. 3. However, the small memory sectors 308A–D can be other shapes. The small memory sectors 308A–D have dimensions normally measured in the X and Y directions. When small memory sectors 308A–D is rectangular, its physical dimensions are its length in the X and Y directions. The large memory sectors 302 have a dimension that is greater than a dimension of the small memory sectors 308A–D. In a preferred embodiment, the smaller memory sectors 308A–D have the same width (x-axis dimension as shown in FIG. 3) as the larger memory sectors 302. This provides for a more uniform layout of the memory sectors. Consequently, the height of such small memory sectors 308A–D is preferably less than the height of the larger memory sectors 302.

It is preferred that in the embodiment shown in FIG. 3, the y-decoders 314, 316 and x-decoder 322 handle any logical to physical address mapping. It is desirable to have the small memory sectors 308A–D addressed as either the first or last logical memory addresses. Because the small memory sectors 308A–D are physically located between large memory sectors 302, a logical to physical address mapping is desirable.

The small memory sectors 308A–D have smaller memory capacity than the large memory sectors 302. It is preferred that the sum of the memory capacity of the small memory sectors 308A–D be substantially a whole number multiple of the memory capacity of a large memory sector 302. For example, the small memory sectors 308A–D can have a memory capacity of one-quarter of the memory capacity of a large memory sector 302. The small memory sectors 308A–D can have different memory capacities. For example, if the memory array 300 had only three small memory sectors, the small memory sectors could have memory capacities of substantially one-half, one-quarter, and one-quarter the memory capacity of a large memory sector 302.

It is preferred that the additional area for peripheral circuits 334A is located near a corner of the memory array 300. Circuits are more easily located in areas closer to corners of the memory array because the corner areas can easily have signal lines route to circuits in the corners from both the X and the Y directions. The optional peripheral circuits 330, 332, and 334 can be any circuit. It is preferred that the peripheral circuits 330, 332, and 334 be related to the memory array 300.

In an embodiment shown in FIG. 3, each of the small memory sectors 308A–D are connected to one of the y-decoders 310, 312, 314, and 316 via a different bit-line. That is, only one small sector 308A–D is connected with each bit-line. Such bit-lines can also connect larger memory sectors 302 to the y-decoders 310, 312, 314, and 316. The memory sectors 302, 308A–D are connected to the x-decoder via word-lines and to the y-decoders via bit-lines.

While FIG. 3 illustrates a memory array with two x-decoders and four y-decoders, the present invention can be applied to memory arrays with various numbers of x-decoders and y-decoders. For example, the memory array 300 could have only one x-decoder and only one y-decoder or it could have a single decoding means. Alternatively, the memory array 300 could have a large number of x-decoders and y-decoders.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A semiconductor memory device, comprising:
   (a) a plurality of large memory sectors having a first physical dimension, the plurality of large memory sectors comprising a first large memory sector and a second large memory sector, wherein each of the large memory sectors are independently lockable;
   (b) a plurality of small memory sectors having a physical dimension that is smaller than the first physical dimension, the plurality of small memory sectors comprising a first small memory sector and a second small memory sector, wherein each of the large memory sectors are independently lockable;
   (c) a x-decoder connected with the large and small memory sectors via word-lines comprising a first word-line and a second word-line; and
   (d) a y-decoder connected with the large and small memory sectors via bit-lines comprising a first bit-line and a second bit-line, wherein the y-decoder is connected with the first small memory sector via the first bit-line and the second small memory sector via the second bit-line, wherein a residual area is formed near a corner of the semiconductor memory device, the residual area being defined by the large and small memory sectors, the-x-decoder, and the y-decoder.

2. The semiconductor memory device as recited in claim 1, wherein the first small memory sector and the second small memory sector are connected with the x-decoder via the first word-line.

3. The semiconductor memory device as recited in claim 2, wherein the first large memory sector is connected with the y-decoder via the first bit-line and the second large memory sector is connected with the y-decoder via the second bit-line.

4. The semiconductor memory device as recited in claim 3, wherein each of the small memory sectors have identical memory capacities.

5. The semiconductor memory device as recited in claim 3, wherein the total memory capacity of the plurality of small memory sectors is substantially a whole number multiple of a capacity of a large memory sector of the plurality of large memory sectors.

6. The semiconductor memory device as recited in claim 5, wherein a first subset of the plurality of small memory sectors have smaller memory capacities than a second subset of the plurality of small memory sectors.

7. The semiconductor memory device as recited in claim 6, wherein each memory sector in the first subset has a memory capacity of substantially half the memory capacity of each of the memory sectors in the second subset.

8. The semiconductor memory device as recited in claim 5, wherein each of the small memory sectors have the same memory capacity.

9. The semiconductor memory device as recited in claim 8, wherein each of the small memory sectors have a memory capacity that is substantially one-quarter of a memory capacity of a large memory sector of said plurality of large memory sectors.

10. The semiconductor memory device as recited in claim 9, wherein the x-decoder converts logical addresses to physical addresses.

11. The semiconductor memory device as recited in claim 10, wherein the y-decoder converts logical addresses to physical addresses.

12. A semiconductor memory device having memory sectors of varying sizes, comprising:

(a) a set of first memory sectors having a first physical dimension;

(b) a set of second memory sectors having a second physical dimension that is smaller than the first physical dimension;

(c) a first means for decoding address lines connected with the set of first memory sectors and the set of second memory sectors via word-lines and bit-lines, wherein each of the second memory sectors are connected with the first means via different bit-lines and wherein a residual area is formed near a corner of the semiconductor memory device, the residual area being defined by the large and small memory sectors, and the first means for decoding.

13. The semiconductor memory device as recited in claim 12, wherein the total memory capacity of the set of second memory sectors is substantially a whole number multiple of a capacity of a first memory sector of the set of first memory sectors.

14. The semiconductor memory device as recited in claim 12, wherein each of the second memory sectors have a memory capacity that is substantially one-quarter of a memory capacity of a first memory sectors of the set of first memory sectors.

15. The semiconductor memory device as recited in claim 12, wherein the first means converts logical addresses to physical addresses.

16. The semiconductor memory device as recited in claim 12, wherein the set of second memory sectors are addressed logically at an end of the semiconductor memory device's address space.

17. A semiconductor memory device, comprising:

(a) a plurality of large memory sectors having a first physical dimension, the plurality of large memory sectors comprising a first large memory sector and a second large memory sector;

(b) a plurality of small memory sectors having a physical dimension that is smaller than the first physical dimension, the plurality of small memory sectors comprising a first small memory sector and a second small memory sector;

(c) a x-decoder connected with the large and small memory sectors via word-lines comprising a first word-line and a second word-line; and (d) a y-decoder connected with the large and small memory sectors via bit-lines comprising a first bit-line and a second bit-line, wherein the y-decoder is connected with the first small memory sector via the first bit-line and the second small memory sector the second bit-line; wherein the first small memory sector and the second small memory sector are connected with the x-decoder via the first word-line;

wherein the first large memory sector is connected with the y-decoder via the first bit-line and the second large memory sector is connected with the y-decoder via the second bit-line;

wherein each of the small memory sectors have identical memory capacities;

wherein the total memory capacity of the plurality of small sectors is substantially a whole number multiple of a capacity of a large memory sector of the plurality of large memory sectors;

wherein the x-decoder and the y-decoder converts logical addresses to physical addresses; and wherein the plurality of small memory sectors are addressed logically at an end of the semiconductor memory device's address space.

* * * * *